United States Patent
Montoya et al.

(10) Patent No.: US 12,308,833 B1
(45) Date of Patent: May 20, 2025

(54) ROOM TEMPERATURE SUPERCONDUCTING CIRCUIT ELEMENTS AND METHODS OF MANUFACTURING THE SAME

(71) Applicant: Toyota Research Institute, Inc., Los Altos, CA (US)

(72) Inventors: Joseph Harold Montoya, Berkeley, CA (US); Abraham Silar Anapolsky, San Mateo, CA (US)

(73) Assignees: Toyota Research Institute, Inc., Los Altos, CA (US); Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 18/436,502

(22) Filed: Feb. 8, 2024

(51) Int. Cl.
*H03K 17/92* (2006.01)

(52) U.S. Cl.
CPC ............................. *H03K 17/92* (2013.01)

(58) Field of Classification Search
CPC ........................................ H03K 17/92
USPC ................................................ 327/527
See application file for complete search history.

(56) References Cited

U.S. PATENT DOCUMENTS

| | | |
|---|---|---|
| 7,005,303 B2 | 2/2006 | Hintermaier et al. |
| 7,304,880 B2 | 12/2007 | Mizuuchi et al. |
| 2019/0058105 A1* | 2/2019 | Pais ............. H10N 30/40 |

OTHER PUBLICATIONS

Du et al., "Room-Temperature Superconductivity in Yb/Lu Substituted Clathrate Hexhydrides under Moderate Pressure," Research, vol. 2022, Article ID: 9784309, Aug. 9, 2022, pp. 1-12.
Zou et al., "Tuning superconductivity in vanadium nitride films by adjusting strain," Phys. Rev. B. vol. 105, Issue 22, Jun. 1, 2022, 7 pages.

* cited by examiner

*Primary Examiner* — Tomi Skibinski
(74) *Attorney, Agent, or Firm* — Christopher G. Darrow; Darrow Mustafa PC

(57) ABSTRACT

A superconducting circuit element includes a piezoelectric or ferroelectric thin film formed on a rigid substrate. The piezoelectric or ferroelectric thin film has one or more circuit element openings and an under compression room temperature superconductor material disposed within the one or more circuit element openings. Actuation of the thin film applies a compressive stress on the under compression room temperature superconductor material such that a room temperature superconducting circuit element is formed on the rigid substrate.

20 Claims, 7 Drawing Sheets

US 12,308,833 B1

ROOM TEMPERATURE SUPERCONDUCTING CIRCUIT ELEMENTS AND METHODS OF MANUFACTURING THE SAME

TECHNICAL FIELD

The present disclosure generally relates to electronic circuit elements, and particularly to room temperature superconducting electronic circuit elements.

BACKGROUND

Superconductor electronics typically combine passive (linear) and active (nonlinear) superconducting elements into circuits and systems that include non-superconducting circuit elements to provide electronic devices such as amplifiers, power sources, and controllers, among others. However, cooling of the superconducting circuit elements below their critical temperature (Tc) can be costly.

The present disclosure addresses issues related to superconductor circuit elements, among other issues related to superconductor electronics.

SUMMARY

This section provides a general summary of the disclosure, and is not a comprehensive disclosure of its full scope or all of its features.

In one form of the present disclosure, a superconducting circuit element includes a rigid substrate, a thin film, and an under compression room temperature (UC-RT) superconductor material disposed at least partially within the thin film. For example, the thin film has one or more circuit element openings and the UC-RT superconductor material is disposed within the one or more circuit element openings. Also, the thin film is a piezoelectric thin film or a ferroelectric thin film, and actuation of the thin film applies a compressive stress on the UC-RT superconductor material such that a RT superconducting circuit element is formed on the rigid substrate.

In another form of the present disclosure, a superconducting circuit element includes a rigid substrate, a piezoelectric thin film disposed on the rigid substrate, and a UC-RT superconductor material disposed at least partially within the piezoelectric thin film. The piezoelectric thin film has one or more circuit element openings, the UC-RT superconductor material is disposed within the one or more circuit element openings, and actuation of the piezoelectric thin film applies a compressive stress on the UC-RT superconductor material such that a RT superconducting circuit element is formed on the rigid substrate.

In still another form of the present disclosure, a superconducting circuit element includes a rigid substrate, a ferroelectric thin film disposed on the rigid substrate, and a UC-RT superconductor material disposed at least partially within the ferroelectric thin film. The ferroelectric thin film has one or more circuit element openings, the UC-RT superconductor material is disposed within the one or more circuit element openings, and actuation of the ferroelectric thin film applies a compressive stress on the UC-RT superconductor material such that a RT superconducting circuit element is formed on the rigid substrate.

Further areas of applicability and various methods of enhancing the disclosed technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

Figure 1A:
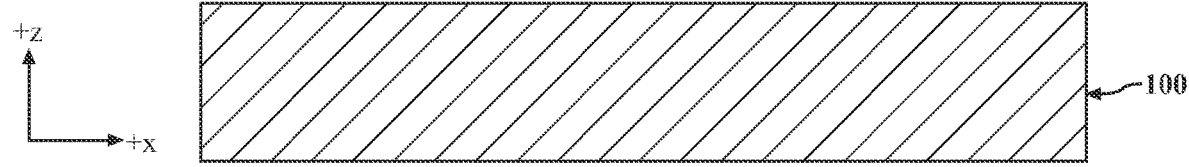
FIG. 1A illustrates a side cross-sectional view of a rigid substrate used for the manufacture of room temperature (RT) superconducting circuit elements according to the teachings of the present disclosure.
Figure 1B:
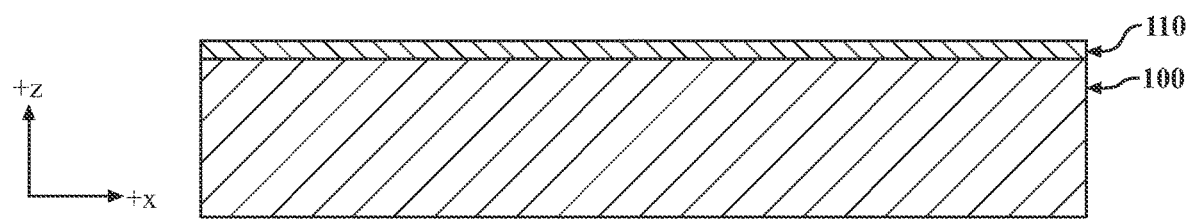
FIG. 1B illustrates the rigid substrate in FIG. 1A with a piezoelectric or ferroelectric thin film deposited and/or formed thereon according to the teachings of the present disclosure.

It should be noted that the figures set forth herein are intended to exemplify the general characteristics of the UC-RT superconductor circuit elements of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present teachings provide improved or enhanced room temperature (RT) superconducting electronic circuit elements and methods for manufacturing RT superconducting circuit elements. As used herein, the phrase "room temperature" refers to a temperature between 20 degrees Celsius (° C.) and 22° C. The RT superconducting circuit elements include an under compression-room temperature (UC-RT) superconducting material at least partially embedded in a thin film. As used herein, the phrase "UC-RT superconducting material" refers to a material that exhibits RT superconductivity when subjected to at least a predefined amount of compressive stress and the phrase "thin film" refers to a layer of material with an average thickness less than or equal to 2 millimeters (mm). Non-limiting examples of UC-RT superconducting material include yttrium barium copper oxides (YBCO), magnesium diboride ($MgB_2$), mercury-barium-calcium-copper-oxides (HgBaCaCuO), bismuth strontium calcium copper oxide (BiSrCaCuO), ruthenium(IV) oxide ($RuO_2$), strontium iridium oxide ($Sr_2IrO_4$), lanthanum copper oxide ($La_2CuO_4$), lanthanum copper oxide ($LaCuO_3$), and europium iron cobalt arsenide (Eu($Fe_{0.88}Co_{0.12})_2As_2$), among others.

In some variations, the UC-RT superconducting material is subjected to a compressive stress (pressure) from or by a piezoelectric thin film. In the alternative, or in addition to, the UC-RT superconducting material is subjected to a compressive stress (pressure) from or by a ferroelectric thin film. For example, in some variations, a piezoelectric thin film is subjected to a voltage bias, which in turn imposes and/or results in a strain in the piezoelectric thin film and a compressive stress on the UC-RT superconducting material. And in other variations, a ferroelectric thin film is subjected to an electric field, which in turn imposes and/or results in a strain in the ferroelectric thin film and a compressive stress on the UC-RT superconducting material.

As used herein, the phrase "piezoelectric thin film" refers to a thin film of piezoelectric material that exhibits strains induced by an applied voltage and the phrase "ferroelectric thin film" refers to a thin film of ferroelectric material that exhibits strain induced by an electric field. Non-limiting examples of piezoelectric materials include lead zirconate titanate ($PbZr/TiO_3$, also known as PZT), lead titanate ($PbTiO_3$), barium titanate ($BaTiO_3$), aluminum nitride (AlN), zinc oxide (ZnO), tourmaline quartz, langasite, lithium niobate ($LiNbO_3$), potassium niobate ($KNbO_3$), lead niobate ($PbNbO_3$), barium niobate ($BaNbO_3$), and sodium niobate ($NaNbO_3$), among others. And non-limiting examples of ferroelectric materials include the same materials listed above for piezoelectric materials.

Referring now to FIGS. 1A-1F, illustrative steps for manufacturing RT superconducting circuit elements are shown. Particularly, and with reference to FIGS. 1A-1B, a piezoelectric or ferroelectric thin film 110 is deposited onto a rigid substrate 100. Non-limiting examples of the rigid substrate 100 include a silicon substrate (e.g., a silicon wafer), a gallium arsenide substrate, and a germanium substrate, among others. And non-limiting techniques for forming the piezoelectric or ferroelectric thin film 110 on the rigid substrate 100 include thin film deposition techniques such as chemical vapor deposition (CVD) techniques and physical vapor deposition (PVD) techniques.

In some variations, the piezoelectric or ferroelectric thin film 100 has an average thickness (z direction) between about 0.5 micrometers (μm) and about 10 mm. For example, in some variations, the piezoelectric or ferroelectric thin film thin film 100 has an average thickness between about 0.5 μm and about 1 mm, while in other variations the piezoelectric or ferroelectric thin film 110 has an average thickness between about 1.0 μm and about 750 μm. Non-limiting examples of an average thickness of the piezoelectric or ferroelectric thin film 110 include an average thickness between about 1.0 μm and about 10 μm, between about 10 μm and about 20 μm, between about 20 μm and about 30 μm, between about 30 μm and about 40 μm, between about 40 μm and about 50 μm, between about 50 μm and about 60 μm, between about 60 μm and about 70 μm, between about 70 μm and about 80 μm, between about 80 μm and about 90 μm, between about 90 μm and about 100 μm, between about 100 μm and about 110 μm, between about 110 μm and about 120 μm, between about 120 μm and about 130 μm, between about 130 μm and about 140 μm, between about 140 μm and about 150 μm, between about 150 μm and about 160 μm, between about 160 μm and about 170 μm, between about 170 μm and about 180 μm, between about 180 μm and about 190 μm, between about 190 μm and about 200 μm, between about 200 μm and about 210 μm, between about 210 μm and about 220 μm, between about 220 μm and about 230 μm, between about 230 μm and about 240 μm, between about 240 μm and about 250 μm, between about 250 μm and about 260 μm, between about 260 μm and about 270 μm, between about 270 μm and about 280 μm, between about 280 μm and about 290 μm, between about 290 μm and about 300 μm, between about 300 μm and about 310 μm, between about 310 μm and about 320 μm, between about 320 μm and about 330 μm, between about 330 μm and about 340 μm, between about 340 μm and about 350 μm, between about 350 μm and about 360 μm, between about 360 μm and about 370 μm, between about 370 μm and about 380 μm, between about 380 μm and about 390 μm, between about 390 μm and about 400 μm, between about 400 μm and about 410 μm, between about 410 μm and about 420 μm, between about 420 μm and about 430 μm, between about 430 μm and about 440 μm, between about 440 μm and about 450 μm, between about 450 μm and about 460 μm, between about 460 μm and about 470 μm, between about 470 μm and about 480 μm, between about 480 μm and about 490 μm, and between about 490 μm and about 500 μm.

Figure 1C:
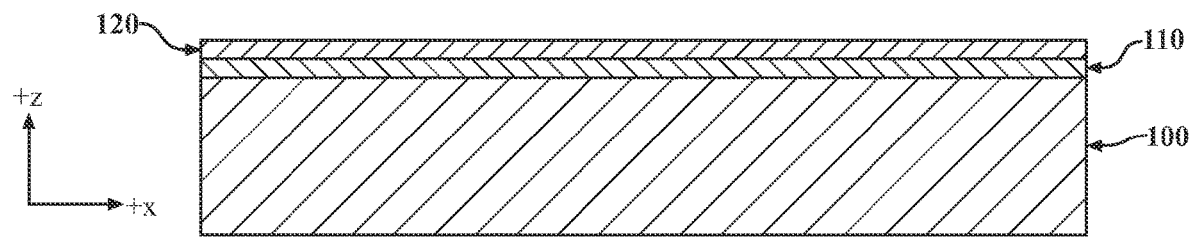
FIG. 1C illustrates FIG. 1B with a mask formed on the piezoelectric or ferroelectric thin film according to the teachings of the present disclosure.
Figure 1D:
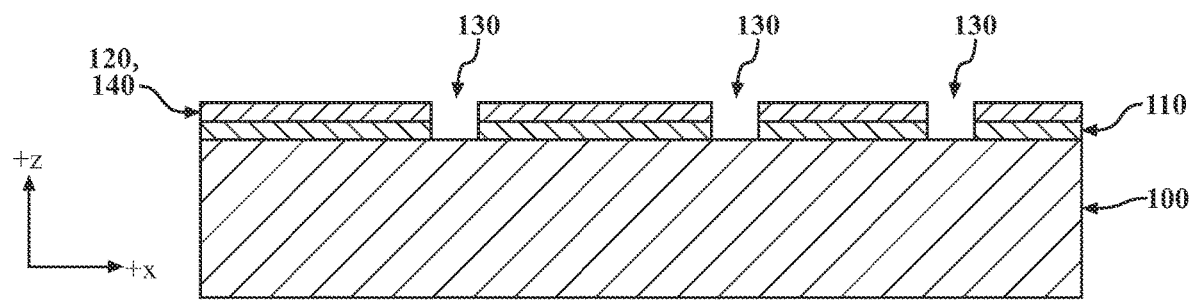
FIG. 1D illustrates FIG. 1C with circuit element openings etched into the mask and the piezoelectric or ferroelectric thin film according to the teachings of the present disclosure.

Referring to FIGS. 1C-1D, the piezoelectric or ferroelectric thin film 110 is masked (FIG. 1C) with a masking material 120 (also referred to herein as "mask 120") and predefined circuit element openings 130 are formed within the mask 120 and the piezoelectric or ferroelectric thin film 110 (FIG. 1D). Non limiting examples of mask materials and/or masking techniques for masking the piezoelectric or ferroelectric thin film 110 include masking techniques such as photoresist, hard or contact masking (metal film on glass), or sacrificial masks made of dielectric, organic, or metal films.

It should be understood that the circuit element openings 130 extend along and at least partially within (−z direction) the piezoelectric or ferroelectric thin film 110 in the x- and y-directions illustrated in the figures. In some variations, the circuit element openings 130 are formed within the mask 120 and the piezoelectric or ferroelectric thin film 110 using an etching technique, e.g., reactive ion etching. Accordingly, the circuit element openings 130 are designed and/or configured for receiving circuit element material. And in at least one variation, the mask 120 is removed from the piezoelectric or ferroelectric thin film 110 and another mask 140 (e.g., a photoresist masking agent) is patterned and applied to the non-patterned area of the piezoelectric or ferroelectric thin film 110.

Figure 1E:
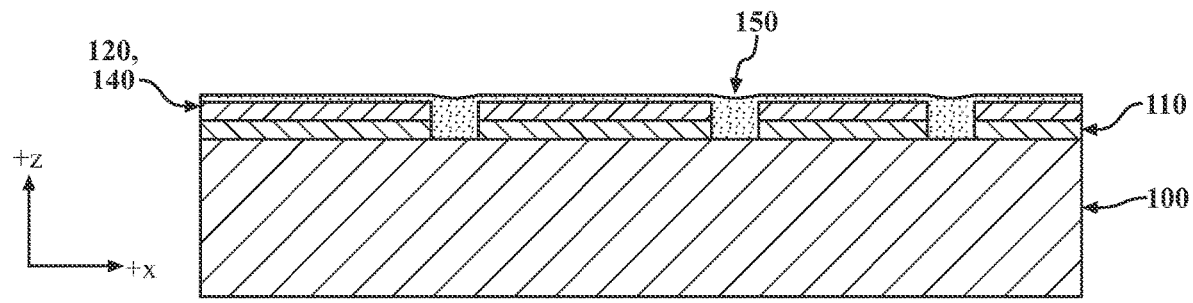
FIG. 1E illustrates FIG. 1D with an under compression RT (UC-RT) superconductor material deposited within the circuit element openings according to the teachings of the present disclosure.
Figure 1F:
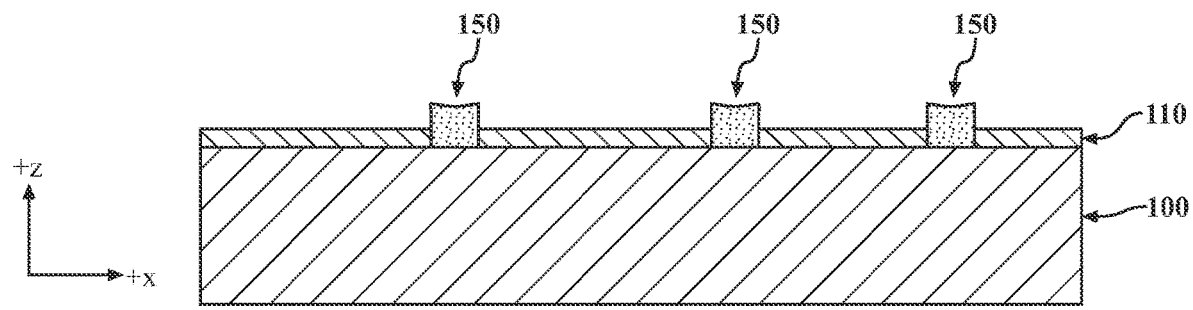
FIG. 1F illustrates FIG. 1E with UC-RT superconductor material on the rigid substrate and at least partially within the piezoelectric or ferroelectric thin film after removal of the mask and excess UC-RT superconductor material according to the teachings of the present disclosure.

Referring to FIG. 1E, a UC-RT superconducting material 150 is deposited into the circuit element openings 130 and onto the mask 120 or mask 140, and excess UC-RT superconducting material is removed as illustrated in FIG. 1F such that only the UC-RT superconducting material 150 deposited into the circuit element openings 130 and the nonpatterned piezoelectric or ferroelectric thin film 110 remain. In some variations, the remaining UC-RT superconducting material 150 is further processed, for example, thermally processed (annealed) via rapid thermal annealing.

Figure 2A:
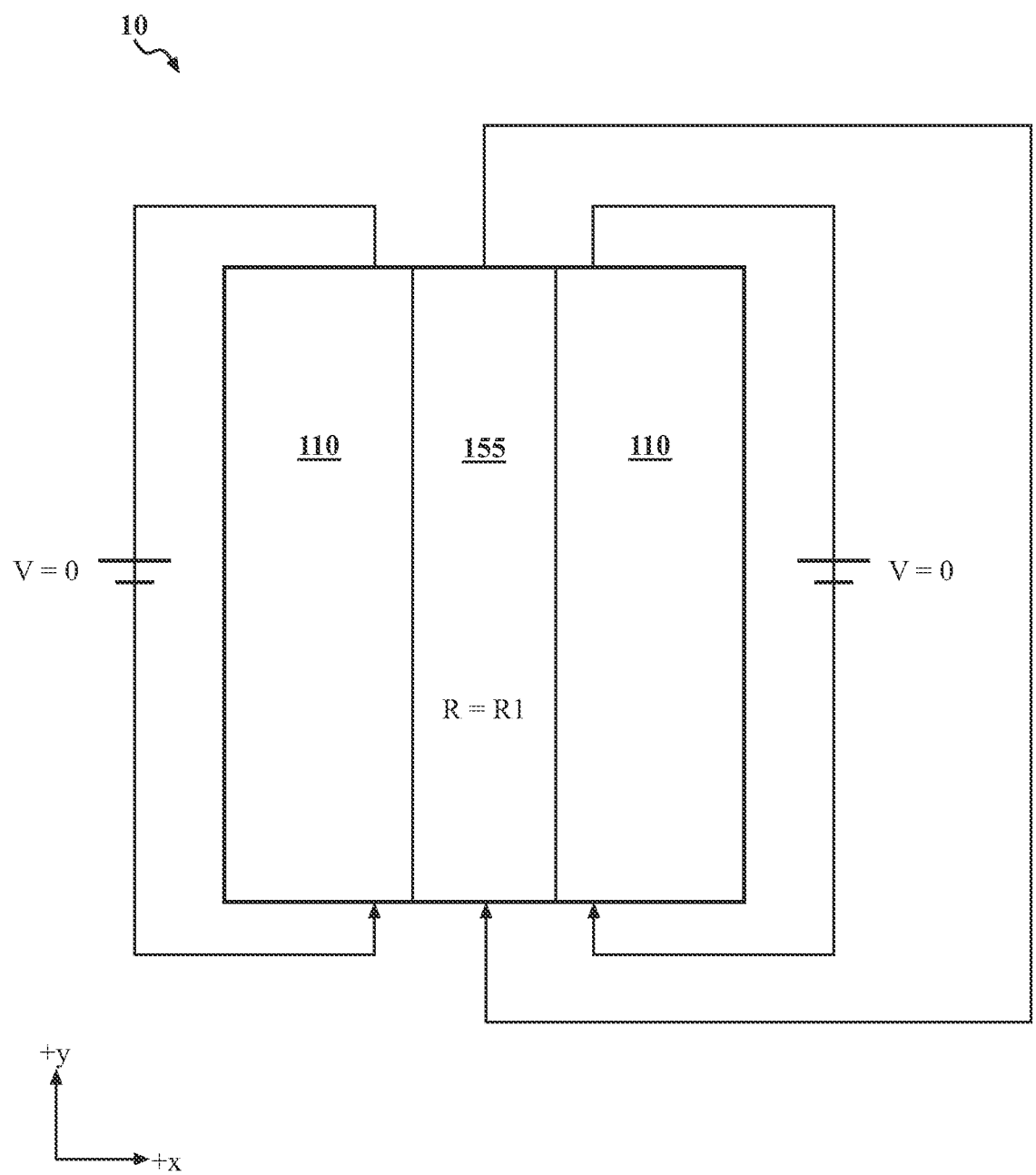
FIG. 2A is a top view of an UC-RT superconductor electronic circuit element with a UC-RT superconductor wire disposed between a pair of piezoelectric thin films according to the teachings of the present disclosure.
Figure 2B:
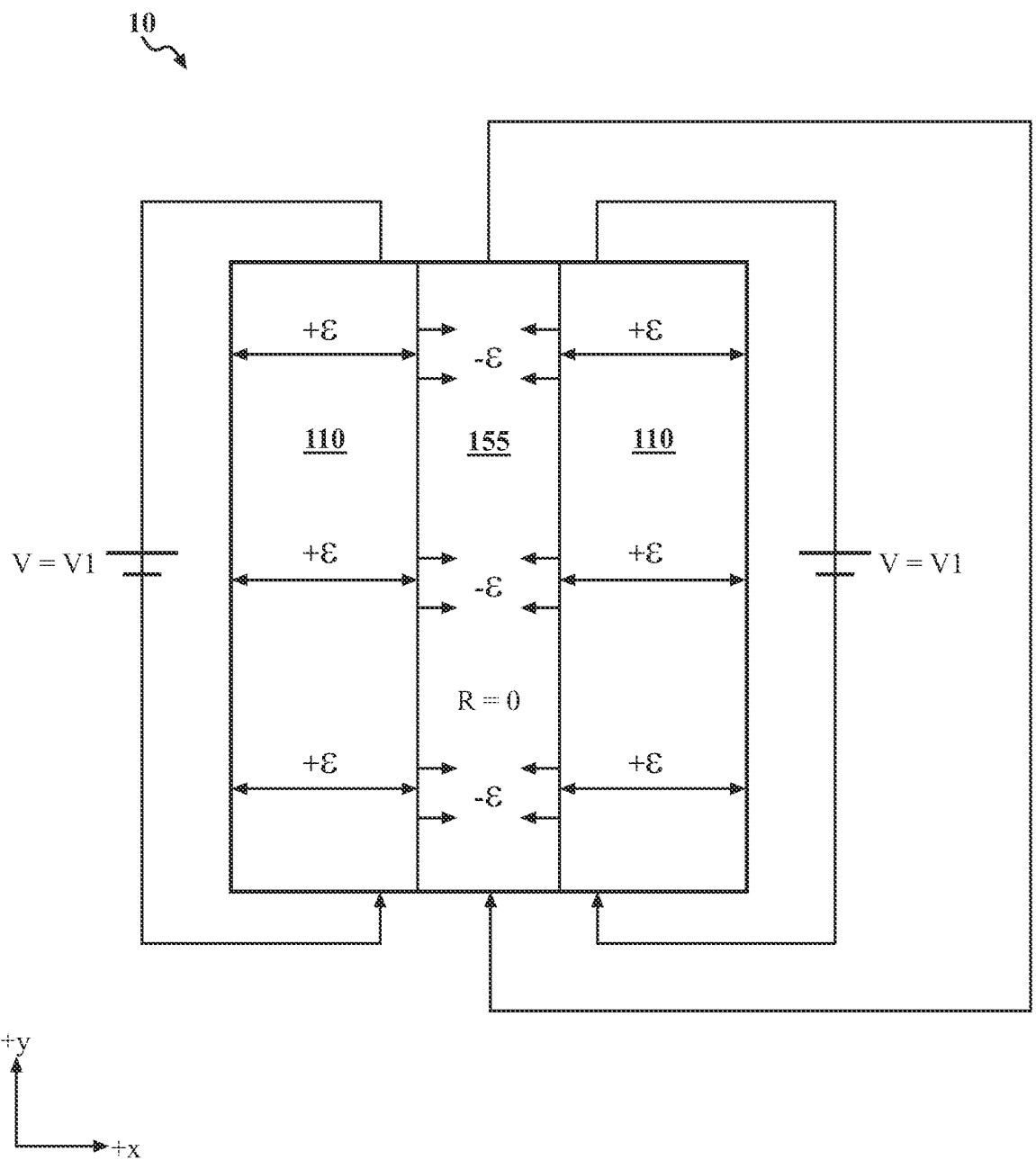
FIG. 2B is a top view of the UC-RT superconductor electronic circuit element in FIG. 2A with a voltage applied to the pair of piezoelectric thin films according to the teachings of the present disclosure.

Referring to FIGS. 2A-2B, a top view of a UC-RT superconducting element 10 formed from piezoelectric thin films 110 and the UC-RT superconducting material 150 described above is shown. Referring particularly to FIG. 2A, the UC-RT superconducting element 10 includes a UC-RT superconducting wire 155, formed from the UC-RT superconducting material 150, disposed between a pair of piezoelectric thin films 110. And as illustrated in FIG. 2A, with a voltage V=0 applied across the pair of piezoelectric thin films 110, the UC-RT superconducting wire 155 has a resistance R=R1>0. However, and with reference to FIG. 2B, when a voltage V=V1≠0 is applied across the pair of piezoelectric thin films 110, the pair of piezoelectric thin films 110 expand (i.e., exhibit a positive strain +ε) which in turn applies a compressive strain (−ε) to the UC-RT superconducting wire 155 such that the UC-RT superconducting wire 155 has a resistance R=0.

For example, and assuming the UC-RT superconducting wire 155 is $RuO_2$, the strains estimated to induce or cause RT superconductivity in the UC-RT superconducting wire 155 are +1.6% and −0.9%, i.e., about 2%, as disclosed in the reference "Superconductivity in Uniquely Strained $RuO_2$ Films" by Uchida et al., Phys. Rev. Lett., 125, 147001. In addition, and assuming the UC-RT superconducting wire 155 has a width (x direction) of 0.5 micrometers (μm) and the piezoelectric thin films 110 are PZT thin films with a width of 4 μm and a piezoelectric coefficient of 500 pC/N, the required strain in each piezoelectric thin film 110 is (0.02*0.5 μm)/2=0.005 μm/4 μm=0.00125, and the required potential (V−$V_{OC}$) across each piezoelectric thin film 110 is therefore 0.00125*4 μm/(500 pC/N)=10 V. Accordingly, applying a 10 V potential (i.e., V1=10 V) across the piezoelectric thin films 110 transforms the UC-RT superconducting wire 155 into a superconducting electronic element at RT. And while FIGS. 2A-2B illustrate piezoelectric thin films 110, it should be understood that that the UC-RT superconducting element 10 can be formed with a pair of ferroelectric thin films 110 and an electric field can be applied across the pair of ferroelectric thin films 110 such that the pair of ferroelectric thin films 110 expand (i.e., exhibit a positive strain +ε) which in turn applies a compressive strain (−ε) to the UC-RT superconducting wire 155 such that the UC-RT superconducting wire 155 has a resistance R=0.

It should be understood that the UC-RT superconducting element 10 can be used as a switch in an electronic circuit. That is, by applying and removing a desired potential or electric field across the piezoelectric thin films 110 or the ferroelectric thin films 110, respectively, the UC-RT superconducting element 10 is turned on (i.e., R=0) and off (i.e., R>0), respectively. In the alternative, or in addition to, the UC-RT superconducting element 10 can be used as, or part of, an electronic circuit element (also referred to herein simply as "circuit element") as described below.

Figure 3:
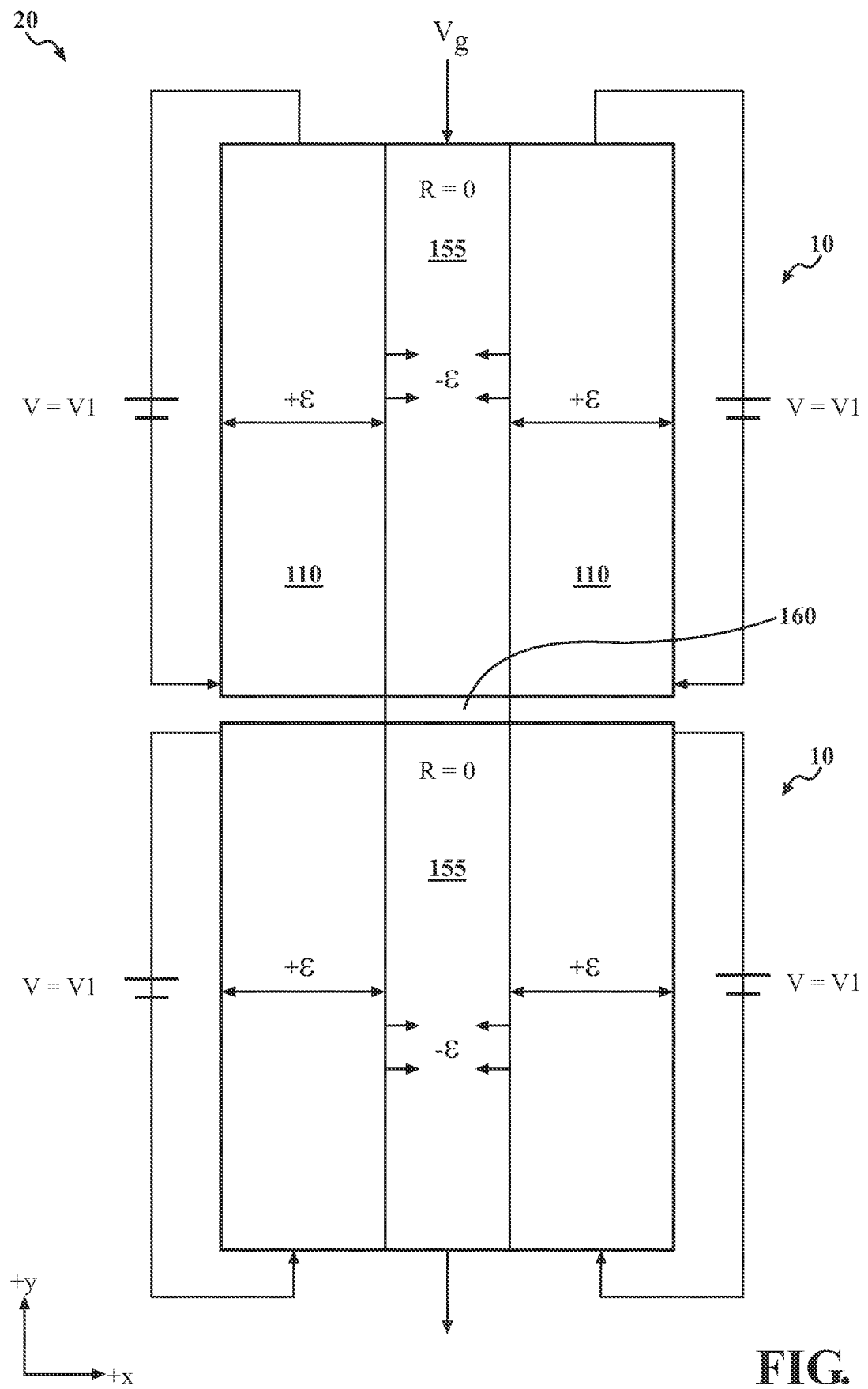
FIG. 3 is a top view of a Josephson junction according to the teachings of the present disclosure.

Referring to FIG. 3, a top view of a Josephson junction 20 according to the teachings of the present disclosure is shown. As used herein, the phrase "Josephson junction" refers to a device with two superconducting elements weakly coupled with a region that is either non-superconducting or is weaker superconducting than the two superconducting elements. The Josephson junction 20 includes a pair of the UC-RT superconducting elements 10 discussed above with a thin non-superconducting layer 160 sandwiched therebetween. Particularly, the thin non-superconducting layer 160 is sandwiched between an upper (+y direction) UC-RT superconducting element 10 and a lower (−y direction) UC-RT superconducting element 10. In some variations, the thin non-superconducting layer 160 has a thickness between about 0.5 μm and about 10 μm.

During operation, a voltage V1 (or an electric filed—not shown) is applied across the pair of piezoelectric thin films 110 (or a pair of ferroelectric thin films 110) of the upper UC-RT superconducting element 10 and the pair of piezoelectric thin films 110 (or a pair of ferroelectric thin films 110) of the lower UC-RT superconducting element 10 such that the UC-RT superconducting wires 155 are superconducting (at RT) but the thin non-superconducting layer 160 is not superconducting. In addition, applying a voltage $V_g$ across the Josephson junction 20 results in Cooper electron pairs (also known simply as "Cooper pairs") tunnelling (i.e., passing or flowing) through the thin non-superconducting layer 160 via a phenomenon known as the Josephson effect. And it should be understood that controlling the voltage $V_g$ controls the number of Cooper pairs tunneling through the thin non-superconducting layer 160 (i.e., the current) and thereby results in a lossless non-linear inductor. It should also be understood that via the UC-RT superconducting element 10, the Josephson junction 20 is a RT Josephson junction. In the alternative, or in addition to, the Josephson junction 20 operates or functions at slightly below RT, e.g., between 0° C. and 20° C.

Figure 4:
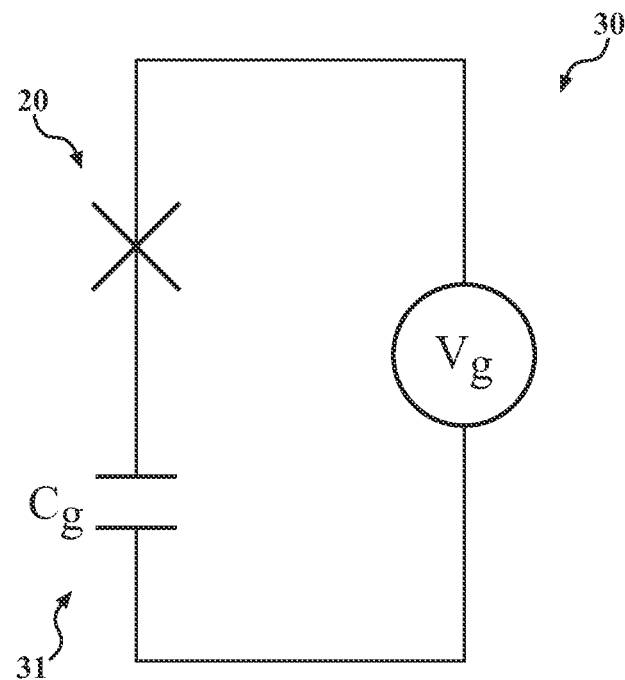
FIG. 4 is a circuit diagram of a charge qubit with a Josephson junction according to the teachings of the present disclosure.

Referring to FIG. 4, a circuit (i.e., a circuit diagram) for a charge qubit 30 is shown. The charge qubit 30 includes a Josephson junction 20 as discussed above (shown or represented by the circuit element symbol "X") and a capacitor 300. As used herein, the term "qubit" refers to a basic unit of quantum information and the phrase "charge qubit" refers to a qubit whose basis quantum states are charge states (i.e., states which represent the presence or absence of excess Cooper pairs in the thin non-superconducting layer 160). Not being bound by theory, the Josephson junction 20 provides the charge qubit 30 with an anharmonic circuit potential that leads to a non-equidistant spacing of energy levels for the charge qubit 30 and enables unique addressing of each energy level transition. In addition, such superconducting charge qubits are used in quantum electronic devices such as quantum computers.

Figure 5:
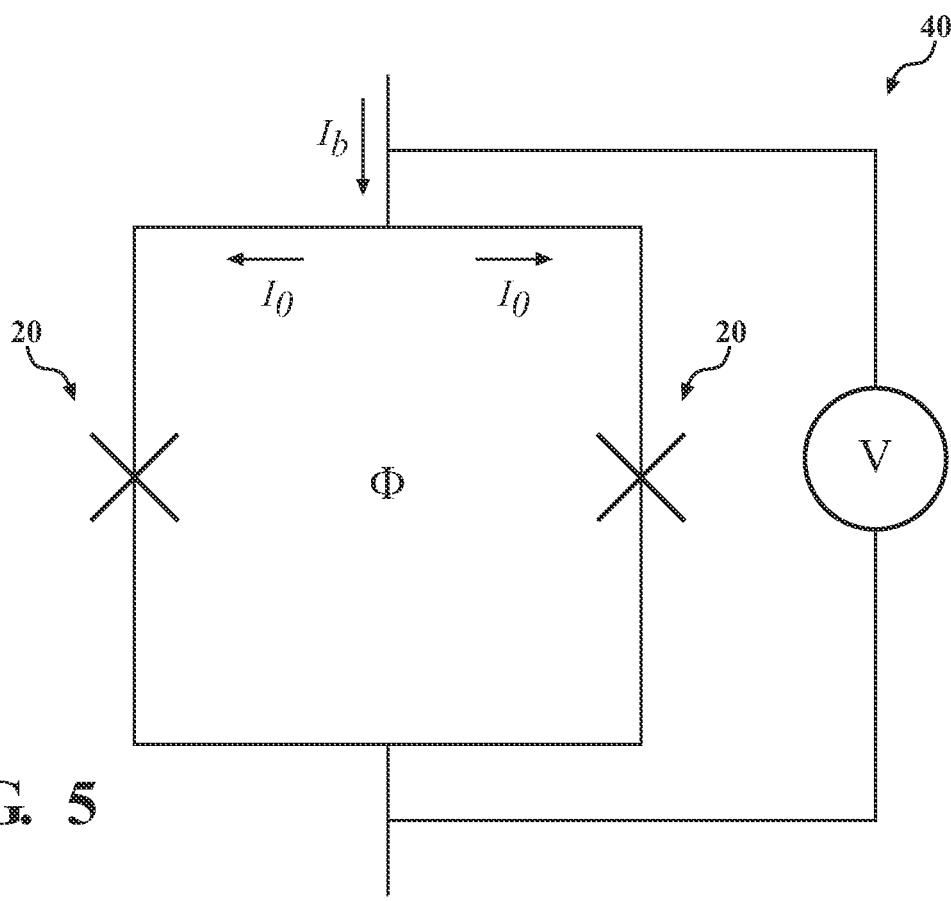
FIG. 5 is a superconducting quantum interference device (SQUID) with a pair of Josephson junctions according to the teachings of the present disclosure.

Referring to FIG. 5, a circuit (i.e., a circuit diagram) for a superconducting quantum interference device (SQUID) 40 is shown. As used herein, the term "SQUID" refers to a magnetometer used to measure extremely weak magnetic fields (e.g., as low as $5 \times 10^{-14}$ tesla). The SQUID 40 includes a pair of Josephson junctions 20 discussed above. Not being bind by theory, a bias current $I_b$ is applied to the SQUID 40 such that a critical current $I_o$ flows through the SQUID 40 such that a voltage V is generated and detected in response to a magnetic flux Φ threading (passing through) the SQUID 40. In addition, the SQUID 40 can be used as a detector in medical equipment (e.g., magnetoencephalography (MEG), magnetocardiography (MCG), electroencephalogram (EEG) or electrocardiogram (EKG)), military sensors, among others.

Figure 6:
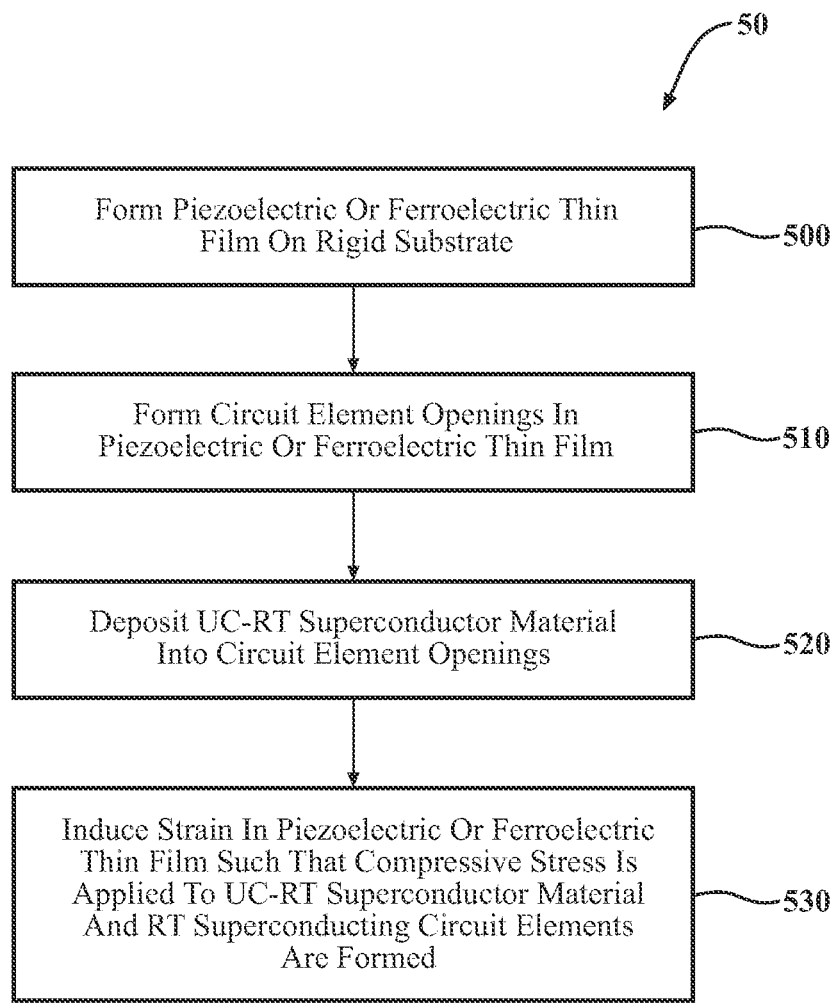
FIG. 6 is a flow chart for a method of forming UC-RT superconducting circuit elements according to the teachings of the present disclosure.

Referring to FIG. 6, a method 50 for forming RT superconducting circuit elements is shown. The method 50 includes forming a piezoelectric or ferroelectric thin film on a rigid substrate at 500 and forming circuit element openings in the piezoelectric or ferroelectric thin film 110 at 510. The method 50 also includes depositing UC-RT superconductor material into the circuit element openings at 520 and creating a strain in the piezoelectric or ferroelectric thin film 110 at 530 such that compressive stress is applied to the UC-RT superconductor material and UC-RT superconducting circuit elements are formed on the rigid substrate.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different orders without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should also be understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure. In addition, Attachment A, filed with the present disclosure, is incorporated herein in its entirety by reference.

What is claimed is:

1. A superconducting circuit element comprising:
   a room temperature (RT) superconducting circuit element comprising:
      a thin film, with one or more circuit element openings, disposed on a rigid substrate, the thin film selected from the group consisting of a piezoelectric thin film and a ferroelectric thin film; and
      an under compression room temperature (UC-RT) superconductor material disposed within the one or more circuit element openings such that actuation of the thin film applies a compressive stress on the UC-RT superconductor material and the RT superconducting circuit element is formed on the rigid substrate.

2. The superconducting circuit element according to claim 1, wherein the thin film has a thickness between about 0.5 μm and about 2 mm.

3. The superconducting circuit element according to claim 2, wherein the thin film is the piezoelectric thin film.

4. The superconducting circuit element according to claim 3, wherein the piezoelectric thin film is formed from a piezoelectric material selected from the group consisting of lead zirconate titanate, lead titanate, barium titanate, aluminum nitride, zinc oxide, tourmaline quartz, langasite, lithium niobate, potassium niobate, lead niobate, barium niobate, and sodium niobate.

5. The superconducting circuit element according to claim 2, wherein the thin film is the ferroelectric thin film.

6. The superconducting circuit element according to claim 5, wherein the ferroelectric thin film is formed from a piezoelectric material selected from the group consisting of lead zirconate titanate, lead titanate, barium titanate, aluminum nitride, zinc oxide, tourmaline quartz, langasite, lithium niobate, potassium niobate, lead niobate, barium niobate, and sodium niobate.

7. The superconducting circuit element according to claim 1, wherein the UC-RT superconductor material is selected from the group consisting of a yttrium barium copper oxide, a magnesium diboride, a mercury-barium-calcium-copper-oxide, a bismuth strontium calcium copper oxide, a ruthenium (IV) oxide, a strontium iridium oxide, a lanthanum copper oxide, a lanthanum copper oxide, and an europium iron cobalt arsenide.

8. The superconducting circuit element according to claim 1, wherein the RT superconducting circuit element is a RT superconducting wire.

9. The superconducting circuit element according to claim 1, wherein the RT superconducting circuit element is a RT Josephson junction.

10. The superconducting circuit element according to claim 1, wherein the RT superconducting circuit element is a RT charge qubit.

11. The superconducting circuit element according to claim 1, wherein the RT superconducting circuit element is a RT superconducting quantum interference device.

12. A superconducting circuit element comprising:
   a room temperature (RT) superconducting circuit element comprising:
      a piezoelectric thin film, with one or more circuit element openings, disposed on a rigid substrate; and
      an under compression room temperature (UC-RT) superconductor material disposed within the one or more circuit element openings such that actuation of the piezoelectric thin film applies a compressive stress on the UC-RT superconductor material and the RT superconducting circuit element is formed on the rigid substrate.

13. The superconducting circuit element according to claim 12, wherein the piezoelectric thin film has a thickness between about 0.5 μm and about 2 mm.

14. The superconducting circuit element according to claim 13, wherein the piezoelectric thin film is formed from a piezoelectric material selected from the group consisting of lead zirconate titanate, lead titanate, barium titanate, aluminum nitride, zinc oxide, tourmaline quartz, langasite, lithium niobate, potassium niobate, lead niobate, barium niobate, and sodium niobate.

15. The superconducting circuit element according to claim 14, wherein the UC-RT superconductor material is selected from the group consisting of a yttrium barium copper oxide, a magnesium diboride, a mercury-barium-calcium-copper-oxide, a bismuth strontium calcium copper oxide, a ruthenium (IV) oxide, a strontium iridium oxide, a lanthanum copper oxide, a lanthanum copper oxide, and an europium iron cobalt arsenide.

16. The superconducting circuit element according to claim 15, wherein the RT superconducting circuit element is selected from the group consisting of a RT superconducting wire, a RT Josephson junction, a RT charge qubit, and a RT superconducting quantum interference device.

17. A superconducting circuit element comprising:
a room temperature (RT) superconducting circuit element comprising:
a ferroelectric thin film, with one or more circuit element openings, disposed on a rigid substrate; and
an under compression room temperature (UC-RT) superconductor material disposed within the one or more circuit element openings such that actuation of the ferroelectric thin film applies a compressive stress on the UC-RT superconductor material and the RT superconducting circuit element is formed on the rigid substrate.

18. The superconducting circuit element according to claim 17, wherein the ferroelectric thin film is formed from a piezoelectric material selected from the group consisting of lead zirconate titanate, lead titanate, barium titanate, aluminum nitride, zinc oxide, tourmaline quartz, langasite, lithium niobate, potassium niobate, lead niobate, barium niobate, and sodium niobate.

19. The superconducting circuit element according to claim 18, wherein the UC-RT superconductor material is selected from the group consisting of a yttrium barium copper oxide, a magnesium diboride, a mercury-barium-calcium-copper-oxide, a bismuth strontium calcium copper oxide, a ruthenium (IV) oxide, a strontium iridium oxide, a lanthanum copper oxide, a lanthanum copper oxide, and an europium iron cobalt arsenide.

20. The superconducting circuit element according to claim 19, wherein the RT superconducting circuit element is selected from the group consisting of a RT superconducting wire, a RT Josephson junction, a RT charge qubit, and a RT superconducting quantum interference device.

* * * * *